(12) United States Patent
Lee et al.

(10) Patent No.: US 9,025,624 B2
(45) Date of Patent: May 5, 2015

(54) BEAM GENERATOR

(75) Inventors: Dong-Gun Lee, Hwaseong-si (KR);
Seong-Sue Kim, Seoul (KR);
Hwan-Seok Seo, Suwon-si (KR)

(73) Assignee: Samsung Electronics Co., Ltd.,
Suwon-Si, Gyeonggi-Do (KR)

( * ) Notice: Subject to any disclaimer, the term of this patent is extended or adjusted under 35 U.S.C. 154(b) by 176 days.

(21) Appl. No.: 13/545,733

(22) Filed: Jul. 10, 2012

(65) Prior Publication Data

US 2013/0028273 A1 Jan. 31, 2013

(30) Foreign Application Priority Data

Jul. 25, 2011 (KR) .................. 10-2011-0073490

(51) Int. Cl.
*H01S 3/30* (2006.01)
*H01S 3/02* (2006.01)
*G03F 7/20* (2006.01)
*G03F 1/84* (2012.01)

(52) U.S. Cl.
CPC ........ *G03F 7/70025* (2013.01); *G03F 7/70575* (2013.01); *G03F 1/84* (2013.01)

(58) Field of Classification Search
USPC ..................... 372/5, 21, 22; 375/5
See application file for complete search history.

(56) References Cited

U.S. PATENT DOCUMENTS 7,481,544 B2 * 1/2009 McGuire, Jr. ............. 359/858
8,000,361 B2 * 8/2011 Abe et al. ................ 372/38.02
2007/0109547 A1 * 5/2007 Jungwirth ................ 356/450
2008/0068712 A1 3/2008 Huang et al.
2008/0088810 A1 * 4/2008 Huh et al. ................ 355/30

FOREIGN PATENT DOCUMENTS

| JP | 02-193104 | 7/1990 |
| JP | 10-154345 | 6/1998 |
| JP | 2010-185916 | 8/2010 |

OTHER PUBLICATIONS

Falcone and Bokor, "Dichroic beam splitter for extreme-ultraviolet and visible radiation," Jan. 1983, Optics Letters, vol. 8, No. 1, pp. 21-23.*
T. Sekikawa et al, "Femtosecond extreme-ultraviolet quasi-continuum generation by an intense femtosecond Ti:Sapphire laser," Apr. 1998, J. Opt. Soc. Am. B, vol. 15, No. 4, pp. 1406-1409.*
English Abstract for Publication No. 10-154345.
English Abstract for Publication No. 02-193104.
English Abstract for Publication No. 2010-185916.

* cited by examiner

*Primary Examiner* — Yuanda Zhang
*Assistant Examiner* — Michael Carter
(74) *Attorney, Agent, or Firm* — F. Chau & Associates, LLC

(57) ABSTRACT

A beam generator for an aerial image generating apparatus includes a laser source for emitting a laser beam and a short wavelength beam source for generating a short wavelength beam by processing the laser beam such that the short wavelength beam is coherent with and has a wavelength shorter than that of the laser beam. A spectral unit includes a quartz plate and a spectral layer coated on a surface of the quartz plate. The spectral layer has a Brewster's angle greater than 70° with respect to the laser beam such that the short wavelength beam is reflected from the spectral unit without the laser beam, increasing the reflectivity of the shortwave beam while decreasing the reflectivity and absorptivity of the laser beam in the spectral unit.

11 Claims, 6 Drawing Sheets

BEAM GENERATOR

CROSS-REFERENCE TO RELATED APPLICATIONS

This application claims the benefit of Korean Patent Application No. 10-2011-0073490 filed on Jul. 25, 2011 in the Korean Intellectual Property Office, the contents of which are herein incorporated by reference in their entirety.

BACKGROUND

1. Technical Field

Exemplary embodiments are directed to a beam generator and an apparatus for generating an aerial image using the same, and more particularly, to an extreme ultra-violet (EUV) beam generator and an apparatus for generating an aerial image for an exposure mask using the same.

2. Discussion of the Related Art

As semiconductor devices have become more highly integrated and downsized, finer patterns are required and wiring widths and gap spacings between the wirings need to be downsized. In particular, a photolithography exposure process for forming fine patterns becomes more challenging due to the higher resolution of the finer patterns, and thus improving the exposure process resolution has been the subject of considerable research. To improve the exposure process resolution, shortwave beams, such as an ultra-violet (UV) laser beam and an extreme ultra-violet (EUV) laser beam, have been used as the optical source for the exposure process.

Due to the high degree of integration and small critical dimension (CD) of recent semiconductor devices, tiny defects in the exposure mask can cause process failures in the circuit patterns transcribed onto on a silicon wafer by the exposure process. To detect tiny defects in the exposure mask, an aerial image of the exposure mask is usually generated in an apparatus for generating the aerial image (hereinafter, aerial image generating apparatus) before performing the exposure process, and the aerial image is fully inspected by a mask inspection process. In a conventional aerial image generating apparatus, the same shortwave beam as used for the exposure process is generated in the beam generator and is used as the optical source for generating the aerial image.

In particular, a conventional beam generator usually generates a shortwave beam the same as or similar to that of the exposure process by using a laser beam, such as an infrared laser beam, because a laser beam has a high degree of spatial and temporal coherence. For example, when the exposure process for patterning circuit patterns on the silicon wafer is performed using an EUV beam, the exposure mask should comprise materials sensitive to the EUV beam. As a result, the aerial image generating apparatus also uses the EUV beam as an incident beam for generating the aerial image for the exposure mask.

However, since the infrared laser beam is coherent with the EUV beam and the infrared laser beam tends to damage the aerial image generating apparatus, the EUV beam can be used without the infrared laser for generating the aerial image of the exposure mask. For those reasons, a conventional beam generator usually includes a beam splitter for separating the EUV beam and the infrared laser beams. The beam splitter reflects the EUV beam and transmits the infrared laser beams.

In a conventional beam generator for an aerial image generating apparatus, the reflectivity of the EUV beam from the beam splitter is low and thus the optical efficiency of the EUV beam is poor. When the incidence angle with respect to the beam splitter of coherent EUV beam and infrared laser beam is increased to increase the reflectivity of the EUV beam, the reflectivity of the infrared beam also increases. The increase of the reflectivity of the infrared beam strengthens the intensity of the infrared beam refracted into the beam splitter, thus heating the beam splitter. For those reasons, a conventional beam generator includes an additional cooling system for reducing the beam splitter temperature, which increases the maintenance and operational cost of the beam generator and of the aerial image generating apparatus including the beam generator.

SUMMARY

Exemplary embodiments of the present inventive concept provide a beam generator in which the reflectivity of a shortwave beam is sufficiently high and the absorption of a laser beam coherent with the shortwave beam is sufficiently low at the beam splitter when optically separating the laser beam and the shortwave beam.

Other exemplary embodiments of the present inventive concept provide an apparatus for generating an aerial image for an exposure mask using the above beam generator.

According to some exemplary embodiments, there is provided a beam generator including a laser source for emitting a laser beam, a short wavelength beam source for generating a short wavelength beam from the laser beam, and a spectral unit including a quartz plate and a first spectral layer coated on a first surface of the quartz plate. The short wavelength beam may be coherent with and have a wavelength shorter than that of the laser beam, and the first spectral layer may have a Brewster's angle greater than 70° with respect to the laser beam such that the short wavelength beam may be reflected from the spectral unit without the laser beam.

In an exemplary embodiment, the laser beam may include a P-polarized infrared beam and the short wavelength beam may include a P-polarized extremely ultra-violet (EUV) beam and the spectral unit and the short wavelength beam source may be configured with respect to each other so that the EUV beam and the infrared beam may be simultaneously incident onto the first spectral layer at an incidence angle greater than the Brewster's angle of the first spectral layer with respect to the infrared beam.

In an exemplary embodiment, the first spectral layer may include a ruthenium layer. In such a case, the ruthenium layer may have a predetermined thickness determined to cancel the infrared beam by destructive interference of first and second reflected infrared beams respectively reflected from top and bottom surfaces of the spectral layer when the infrared beam may be incident onto the spectral layer at an incidence angle less than the Brewster's angle.

In an exemplary embodiment, the first spectral layer may include a niobium nitride layer. In such a case, the niobium nitride layer may have a predetermined thickness determined to cancel the infrared beam by destructive interference of first and second reflected infrared beams respectively reflected from top and bottom surfaces of the spectral layer when the infrared beam may be incident onto the spectral layer at an incidence angle less than the Brewster's angle.

In an exemplary embodiment, the spectral unit may include a second spectral layer coated on a second surface opposite to the first surface of the quartz plate. The second spectral layer may include a same material as the first spectral layer.

In an exemplary embodiment, the short wavelength beam source may include a focusing lens for focusing the laser beam, a gas cell in which the focused laser beam generates the short wavelength beam, and a beam selector for guiding a $0^{th}$ order diffraction beam of the short wavelength beam to the spectral unit.

In an exemplary embodiment, the gas cell may be filled with neon (Ne) gas.

In an exemplary embodiment, the beam generator may further include a monitoring unit for monitoring a transmitted portion of the infrared beam transmitted through the quartz plate of the spectral unit.

In an exemplary embodiment, the beam generator may further include a reflecting unit for reflecting the short wavelength beam onto a target.

In an exemplary embodiment, the reflecting unit may include a multilayered stacked structure having alternating layers of molybdenum and silicon.

According to some exemplary embodiments, there is provided an apparatus for generating an aerial image including a beam generator for generating a short wavelength beam from a laser beam, the short wavelength beam having a wavelength shorter than that of the laser beam, a support for supporting a target mask onto which the short wavelength beam is incident, the target mask including a plurality of fine circuit patterns, a beam detector for detecting optical information of the short wavelength beam reflected from the target mask, and an operator for converting the optical information of the detected short wavelength beam into digital image signals to generate the aerial image of the fine circuit patterns on the target mask. In such a case, the beam generator includes a laser source for emitting the laser beam, a short wavelength beam source for generating the short wavelength beam from the laser beam, the short wavelength beam being coherent with the laser beam; and a spectral unit including a quartz plate and a first spectral layer coated on a first surface of the quartz plate, the first spectral layer having a Brewster's angle greater than 70° with respect to the laser beam such that the short wavelength beam is reflected from the spectral unit without the laser beam.

In an exemplary embodiment, the fine circuit pattern has a line width less than 45 nm and the short wavelength beam includes an extreme ultra-violet (EUV) beam.

In an exemplary embodiment, the apparatus may further include a Fresnel lens interposed between the beam generator and the target mask to focus the short wavelength beam into a single focal point beam incident onto the target mask.

According to some exemplary embodiments, there is provided a beam generator including a beam source for generating an infrared laser beam and an extreme ultraviolet (EUV) beam coherent with each other; and a spectral unit including a quartz plate and a first spectral layer coated on a first surface of the quartz plate. The first spectral layer has a Brewster's angle greater than about 70° with respect to the infrared laser beam so that the EUV beam is reflected from the spectral unit without the laser beam. The spectral unit and the beam source are configured with respect to each other so that the EUV beam and the infrared beam are simultaneously incident onto the first spectral layer at an incidence angle greater than the Brewster's angle of the first spectral layer with respect to the infrared laser beam.

In an exemplary embodiment, the beam source includes a laser source for emitting the laser beam, and a short wavelength beam source for generating the EUV beam from the laser beam. The short wavelength beam source includes a focusing lens for focusing the laser beam, a gas cell containing neon gas with which the focused laser beam interacts to generate the EUV beam, and a beam selector for guiding a $0^{th}$ order diffraction beam of the EUV beam to the spectral unit.

In an exemplary embodiment, the infrared laser beam is a P-polarized infrared laser beam and the EUV beam is a P-polarized EUV beam, and the spectral unit includes a second spectral layer coated on a second surface opposite to the first surface of the quartz plate, the second spectral layer including a same material as the first spectral layer.

In an exemplary embodiment, the first spectral layer includes a ruthenium layer whose thickness is determined to cancel the infrared beam by destructive interference of first and second reflected infrared beams respectively reflected from top and bottom surfaces of the spectral layer when the infrared beam is incident onto the spectral layer at an incidence angle less than the Brewster's angle.

In an exemplary embodiment, the first spectral layer includes a niobium nitride layer whose thickness is determined to cancel the infrared beam by destructive interference of first and second reflected infrared beams respectively reflected from top and bottom surfaces of the spectral layer when the infrared beam is incident onto the spectral layer at an incidence angle less than the Brewster's angle.

According to exemplary embodiments of the present inventive concept, the beam generator may include a spectral unit or a beam splitter having a large Brewster's angle and a high transmittance to increase the reflectivity of the short-wave beam such as a EUV beam and decreasing the reflectivity and absorptivity of the laser beam coherent with the shortwave beam. Accordingly, the optical efficiency of the shortwave beam may increase and the increased reflectivity of the EUV beam may increase the resolution of the aerial image in the aerial image generating apparatus. Further, no additional cooling system for the beam splitter is needed, thereby reducing the operational and maintenance cost of the beam generator.

DETAILED DESCRIPTION OF THE EMBODIMENTS

Figure 1:
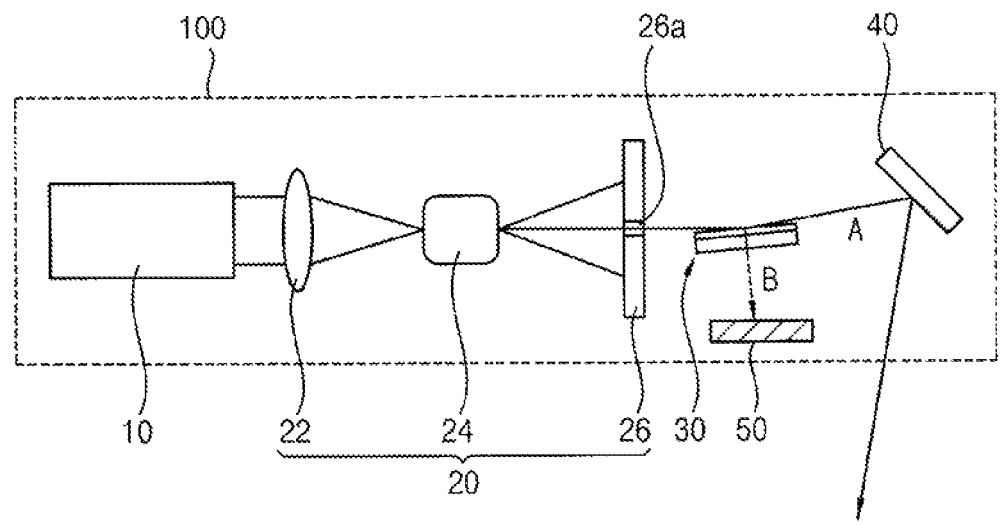
FIG. 1 is a structural view illustrating a beam generator for generating a short wavelength beam using a laser beam in accordance with an exemplary embodiment of the present inventive concept.

Various exemplary embodiments will be described more fully hereinafter with reference to the accompanying drawings, in which some exemplary embodiments are shown. The present invention may, however, be embodied in many different forms and should not be construed as limited to the exemplary embodiments set forth herein. In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, exemplary embodiments will be explained in detail with reference to the accompanying drawings.

Figure 2:
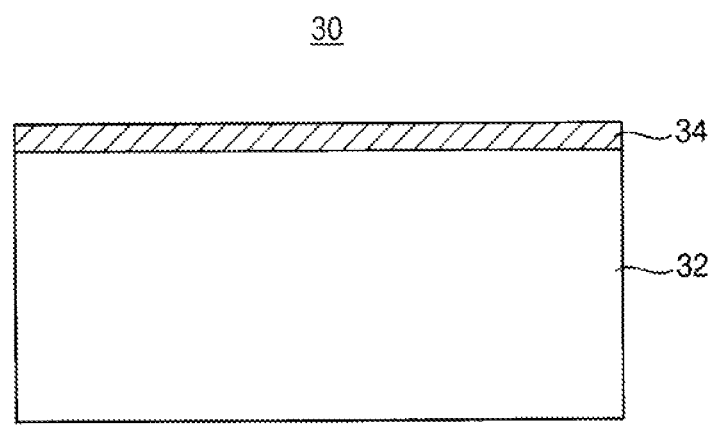
FIG. 2 is a cross-sectional view illustrating a spectral unit of the beam generator shown in FIG. 1.

FIG. 1 is a structural view illustrating a beam generator for generating a short wavelength beam using a laser beam in accordance with an exemplary embodiment of the present inventive concept. FIG. 2 is a cross-sectional view illustrating a spectral unit of the beam generator shown in FIG. 1.

Referring to FIG. 1, a beam generator 100 in accordance with an exemplary embodiment of the present inventive concept may include a laser source emitting a laser beam 10, a short wavelength beam source 20 generating a short wavelength beam by processing the laser beam, a spectral unit 30 including a quartz plate 32 and a first spectral layer 34 coated on a first surface of the quartz plate, a reflecting unit 40 from which the short wavelength beam is reflected onto a target and a monitoring unit 50 for monitoring an infrared beam transmitted through the quartz plate 32 of the spectral unit 30.

For example, the laser source 10 can emit a high-powered ultra-short pulse laser beam with duration below 1 ps, which is in the femtosecond domain, known as a femtosecond laser beam. In a present exemplary embodiment, the laser source may include a titanium-sapphire laser source that can generate pulse durations shorter than about 10 fs with a wavelength of about 800 nm, which is in the near infrared spectrum. In particular, the laser beam may be transformed into a P-polarized laser beam by a polarizer.

The short wavelength beam source 20 may emit a short wavelength beam having a wavelength shorter than that of the laser beam. For example, the short wavelength beam source 20 can generate an extreme ultra violet (EUV) beam having a wavelength of about 12 nm to about 14 nm, much shorter than that of the infrared beams. In a present exemplary embodiment, the short wavelength beam may be coherent or stationary interfered with the laser beam. That is, the EUV beam may be coherent with the infrared beam, and may be referred to herein below as an infrared/EUV beam. For example, the short wavelength beam source 20 can include a focusing lens 22, a gas cell 24 and a beam selector 26 having at least a pin hole.

The laser beam emitted from the laser source 10 can be focused into the gas cell 24 through the focusing lens 22. The gas cell 24 may include minute holes such as inlet and outlet holes (not illustrated) at front and rear portions thereof along the path of the laser beam. In a present exemplary embodiment, neon (Ne) gas fills the gas cell 24, and the laser beam passing into the gas cell 24 may optically interacts with the neon (Ne) gas to generate a short wavelength beam that may be coherent with the laser beam. Since the laser can be an infrared laser, the infrared laser may optically interact with the neon (Ne) gas in the gas cell 24 to generate an EUV beam having a wavelength of about 13.5 nm. While a present exemplary embodiment discloses generating an EUV beam as the short wavelength beam using infrared beams and neon (Ne) gas, other short wavelength and EUV beams may be generated using other wavelength lasers and cell gases in accordance with environmental and other requirements. Hereinafter, the infrared beams and the EUV beams are representative of the laser beam and the short wavelength beam. However, the laser beam and the short wavelength beam are not necessarily an infrared beam and an EUV beam, as would be known to one of the ordinary skill in the art.

Thus, the infrared and the EUV beams may propagate in the same direction and thus both the infrared beam and the EUV beam may propagate through the outlet of the gas cell 24. In particular, the laser beam may be polarized as a P-polarized beam and thus the short wavelength beam may also be generated as a P-polarized beam, and thus both the infrared beam and the EUV beam may be P-polarized beams.

Both the infrared beam and the EUV beams emitted from the outlet of the gas cell 24 may pass through the pinhole 26a at a central portion of the beam selector 26. The beam selector 26 and the gas cell 24 may be configured with respect to each other such that the infrared/EUV beam is incident onto the spectral unit 30 through the pinhole 26a without any interference or diffraction due to the beam selector 26. For example, the outlet of the gas cell 24 and the pinhole 26a of the beam selector 26 may be arranged in the same plane and thus a 0-th order diffraction beam is incident on the spectral unit 30 while higher order diffraction beams such can be prevented from reaching the spectral unit 30.

Then, the coherent infrared beam and the EUV beam may be separated from each other by the spectral unit 30 because of the wavelength differences between the infrared beam (about 800 nm) and the EUV beam (about 13.5 nm). The spectral unit 30 includes a beam splitter.

To perform consecutive mask inspection processes using the beam generator 100, a pure short wavelength or EUV beam may be needed. Thus, the spectral unit 30 separates the EUV beam and the infrared laser beam from the coherent EUV/infrared beam, since the infrared beam is not used for the mask inspection processes. Hereinafter, the beam splitter may be representative of the spectral unit 30 and thus may be used in place of the spectral unit 30.

In a present exemplary embodiment, the beam selector 26 and the beam splitter 30 can be arranged so that the coherent infrared/EUV beam is incident onto the surface of the beam splitter 30 with an angle greater than the Brewster's angle of the infrared beams with respect to the beam splitter 30. A reflection surface of the beam splitter 30 may comprise a material that maximizes the Brewster's angle with respect to the infrared beam. Due to this configuration of the beam splitter 30, the reflectivity of the infrared beams can be minimized and the reflectivity of the EUV beam can be maximized.

As the incidence angle of the coherent infrared/EUV beam may be close to the Brewster's angle, the P-polarized infrared beam can propagate along the reflection surface of the beam splitter 30, thus minimizing the reflection of the infrared beam at the beam splitter 30. In contrast, since the incidence angle of the coherent beam may not be a Brewster's angle for the EUV beam, the P-polarized EUV beam may reflect from the surface of the beam splitter 30. In addition, since the incidence angle of the coherent beam can be adjusted to be greater than the Brewster's angle, and since the reflection surface of the beam splitter 30 can be formed to have as large a Brewster's angle as possible, the incidence angle of the coherent beam can made as large as necessary. For those reasons, the reflectivity of the EUV beam increases as the incidence angle of the coherent beam increases.

The infrared beam starts reflecting from the beam splitter 30 as the incidence angle of the coherent beam deviates from the Brewster's angle, and thus the reflectivity of the infrared beam is proportional to the deviation angle between the incidence angle and the Brewster's angle. Accordingly, the larger the Brewster's angle of the infrared beam, the smaller the deviation angle between the Brewster's angle of the infrared beam and the incidence angle of the coherent beam. As a result, the reflectivity of the infrared beam can be minimized while the reflectivity of the EUV beam can be maximized.

In addition, when the incidence angle of the coherent beam onto the beam splitter 30 deviates from the Brewster's angle, some portion of the infrared beam reflects from the beam splitter 30 (hereinafter, referred to as the reflected infrared beam) while the remaining portion of the infrared beam refracts into the beam splitter 30 (hereinafter, referred to as the refracted infrared beam). When the infrared beam refracts into the beam splitter 30, the temperature of beam splitter 30 gradually increases due to the refracted infrared beam being absorbed by the beam splitter 30. The operation of the beam generator 100 may deteriorate due to the increased temperature of the beam splitter 30. To stabilize operation of the beam generator 100, the beam splitter 30 may be provided with a high reflectivity with respect to the EUV beam and a low absorptivity or high transmittance with respect to the infrared beam.

For an exemplary embodiment, the beam splitter 30 includes a body 32 having a high infrared transmittance and a spectral layer 34 coated on a first surface of the body 32 having a high EUV reflectivity, as illustrated in FIG. 2. Thus, a high proportion of the EUV beam may be reflected from the beam splitter 30 and a high proportion of the refracted infrared beam may be transmitted through the beam splitter 30.

In a present exemplary embodiment, the body 32 of the beam splitter 30 includes a quartz plate having high infrared transmittance, and thus a high proportion of the refracted infrared beam may be transmitted through the beam splitter 30. That is, the absorption of the refracted infrared beam into the body 32 can be minimized by the beam splitter 30, thus substantially preventing the heating of the beam splitter 30 due to the refracted infrared beams. Accordingly, additional cooling or heat transfer systems for cooling the beam splitter 30 are not needed in the present beam generator 100, while a conventional beam generator necessarily needs the additional cooler or heat pump to cool the beam splitter. The body 32 may be substantially thicker than the spectral layer 34. In a present exemplary embodiment, the quartz plate of the body 32 has a thickness of a few millimeters.

The spectral layer 34 can separate the coherent infrared/EUV beam into a separate infrared beam and a separate EUV beam and includes a material having an infrared Brewster's angle greater than about 70°. When the infrared Brewster's angle is less than about 70°, the reflectivity of the EUV beam may be insufficient for performing the mask inspection processes, and the infrared beam may excessively refract into the body 32 of the beam splitter 30. When the incidence angle of the coherent beam is close to the Brewster's angle, the reflectivity of the EUV beam may be poor since the deviation of the EUV beam incidence angle may be very small. In contrast, when the incidence angle of the coherent beam has a large deviation from the Brewster's angle, the infrared beam may excessively refract into the body 32 of the beam splitter 30 and thus heat the beam splitter 30 in the beam generator 100. For those reasons, the Brewster's angle can be adjusted to be greater than about 70°.

For example, the spectral layer 34 may comprise ruthenium (Ru) for which the infrared Brewster's angle is greater than about 80°, thus maximizing reflection of the EUV beam from the spectral layer 34 while minimizing the reflection of the infrared beam. The ruthenium (Ru) layer may have a thickness of a few nanometers to tens of nanometers, in particular, a thickness of about 8 nm to 11 nm, to cancel the reflected infrared beam by destructive interference. The ruthenium (Ru) layer can have any other thickness as long as the reflected infrared beam may be cancelled by destructive interference, as would be known to one of the ordinary skill in the art. The ruthenium (Ru) layer may be formed on the quartz plate 32 by any appropriate process, such as a sputtering process.

The beam splitter 30 can be configured with respect to the beam selector 26 so that the coherent infrared/EUV beam is incident onto the beam splitter 30 at an incidence angle greater than the infrared Brewster's angle of the spectral layer 32. For example, the incidence angle of the coherent beam onto the beam splitter 30 may be about 85°.

Figure 3:
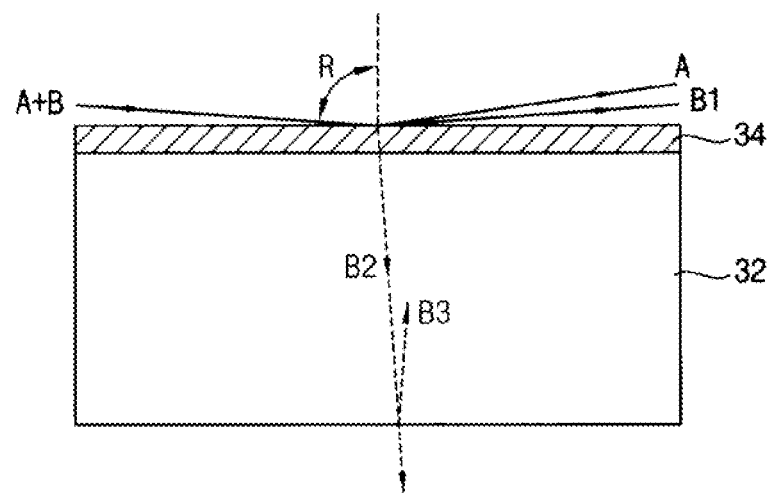
FIG. 3 is a view illustrating an optical path of the EUV beam and the infrared beam on the spectral unit shown in FIG. 2.

FIG. 3 is a view illustrating an optical path of the infrared/EUV beam onto the spectral unit shown in FIG. 2.

Referring to FIG. 3, the coherent infrared/EUV beam A+B may be incident onto the spectral layer 34 at an incidence angle R that is greater than about 80°. Since the incidence angle R may be large and the reflectivity of the EUV beam A is proportional to the incidence angle R, most of the EUV beam A is reflected from the spectral layer 34 of the beam splitter 30, thus increasing the reflectivity of the EUV beam. In a present exemplary embodiment, when the coherent beam A+B is incident onto the spectral layer 34 at an incidence angle R of about 85°, the reflectivity of the EUV beam A may be greater than about 95%, and the infrared beam B may reflect from and refract into the spectral layer 34 at an angle corresponding to the 5° deviation between the Brewster's angle (about 80°) and the incidence angle (about 85°). Thus, the reflectivity of the infrared beam may be very small, for example, less than about 1%. Thus, the coherent beam A+B can be separated into the EUV beam A and the infrared beam B by the Ruthenium (Ru) layer of the spectral unit 30 in such a way to minimize the reflectivity of the infrared beam and maximize the reflectivity of the EUV beam.

If the deviation angle is small, most of the infrared beam B may refract into the beam splitter 30 as the refracted infrared beam B2 and a tiny portion of the infrared beam B may reflect from the beam splitter 30 as the reflected infrared beam B1. In a present exemplary embodiment in which the deviation angle is about 5°, about 1% of the infrared beam B in the coherent beam A+B is converted into the reflected infrared beam B1 and about 99% of the infrared beam is converted into the refracted infrared beam B2 by the Ruthenium layer of the beam splitter 30.

In particular, the quartz plate of the beam splitter 30 may have a sufficient transmittance so that more than about 80% of the refracted infrared beam B2 is transmitted through the body 32 and less than about 20% of the refracted infrared beam B2 is absorbed into the body 32. Therefore, the temperature increase of the beam splitter 30 by the refracted infrared beam can be minimized by the high transmittance of the quartz plate of the beam splitter 30.

According to the beam splitter 30 including the Ruthenium layer and the quartz plate, the EUV beam reflectivity may be about 95% and the infrared beam reflectivity may be less than about 1% when the coherent beam is separated into separate EUV and infrared beams by the beam splitter 30. Thus, the portion of the EUV beam that is lost and unusable for the mask inspection processes may be substantially reduced by the beam generator 100. In addition, the transmittance of the refracted infrared beam B2 through the beam splitter 30 may be greater than about 80%. As compared with a conventional beam generator in which the EUV beam reflectivity is about 70%, there is a greater than 20% increase in the proportion of the EUV beam reflected from the beam splitter 30, increasing the optical efficiency of the beam generator 100. Further, since the infrared beam refraction can be minimized and about 80% of the refracted infrared beam B2 can be transmitted through the quartz plate 32, the temperature increase of the beam splitter 30 can be minimized and the optical properties of the infrared beam can be monitored by detecting the transmitted infrared beam.

The reflecting unit 40 reflects the EUV beam reflected from the beam splitter 30 onto a process target that can be positioned next to the beam generator 100. The reflecting unit 40 may comprise palladium on carbon (Pd/C) or a composite of molybdenum and silicon (Mo/Si). In a present exemplary embodiment, the reflecting unit 40 includes a multilayer stacked structure having more than about 80 alternating layers of molybdenum and silicon formed using a sputtering process, to optimally configure the reflecting unit 40 to reflect an EUV beam having a wavelength of about 13.5 nm.

The monitoring unit 50 can detect the infrared beam transmitted through the quartz plate 32 of the spectral unit 30, and thus the optical properties of the infrared beam emitting from the laser source 10 can be monitored by the monitoring unit 50. For example, the beam intensity and optical shape of the laser beam can be detected by the monitoring unit 50 and the laser source 10 can be adjusted to generate a more uniform laser beam according to the monitoring results.

Accordingly, the beam generator 100 can generate high efficiency shortwave beams that can be separated from the coherent laser beams. In addition, the spectral unit of the beam generator can be prevented from being heated by the laser beams, decreasing the maintenance and operation cost of the beam generator 100. In particular, the spectral unit can be modified in view of the reflectivity of the shortwave beam and the transmittance of the laser beam. Hereinafter, various modifications on the spectral unit 30 are described in detail with reference to FIGS. 4 to 7.

Figure 4:
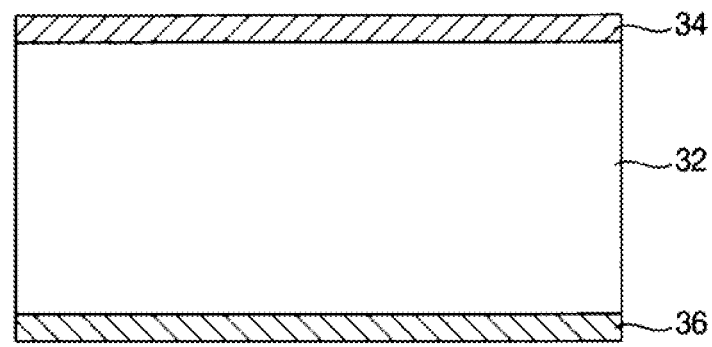
FIG. 4 depicts a modified spectral unit of the beam generator shown in FIG. 1.
Figure 5:
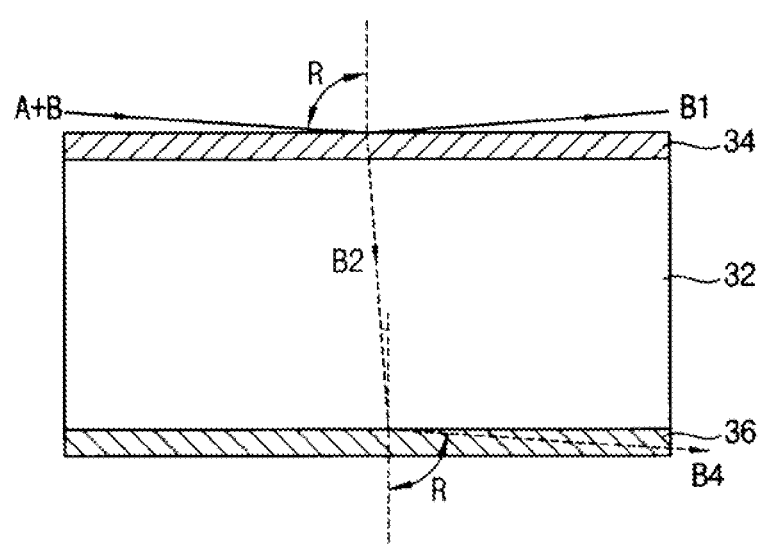
FIG. 5 is a view illustrating an optical path of the infrared beam of the modified spectral unit shown in FIG. 4.

FIG. 4 depicts a modification of the spectral unit of the beam generator shown in FIG. 1. FIG. 5 is a view illustrating an optical path of the infrared beam of the modified spectral unit shown in FIG. 4.

Referring to FIGS. 4 and 5, a modified spectral unit 30a includes a second spectral layer 36 coated on a second surface opposite to the first surface of the body 32. Thus, the modified spectral unit 30a includes a pair of spectral layers 34 and 36 on the quartz plate opposite to each other.

The second spectral layer 36 can prevent the refracted infrared beam B2 from being reflected back into the body 32 of the spectral unit 30 from a bottom surface of the body 32. When the refracted infrared beam B2 propagates through the body 32 to the bottom surface of the body 32, some of the refracted infrared beam B2 may re-reflect into the body 32 as the re-reflected infrared beam B3 (as illustrated in FIG. 3) due to the change of medium from the body 32 to air. However, when the second spectral layer 36 is coated onto the bottom surface of the body 32, the refracted infrared beam refracts into the second spectral layer 36, and thus minimizing the re-reflection of the refracted infrared beam B2 and reducing the absorption of the infrared beam. In particular, when the second spectral layer 36 has the same material and configuration as the first spectral layer 34, the refracted infrared beam B2 may re-refract into the second spectral layer 36 as a re-refracted infrared beam B4 at a refraction angle substantially the same as the incidence angle R of the coherent beam A+B. Since the first and second spectral layers 34 and 36 have the same material properties including the same Brewster's angle, the refracted infrared beam B2 may easily refract into the second spectral layer 36 rather than being re-reflected into the body 32, and may propagate through the second spectral layer 36 along a direction parallel to that of the coherent beam A+B. Accordingly, the transmittance of the refracted infrared beam B2 may be increased by the second spectral layer 36.

Figure 6:
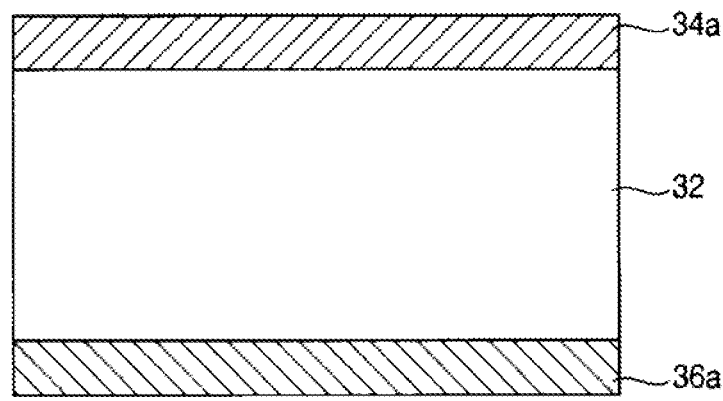
FIG. 6 depicts another modified spectral unit of the beam generator shown in FIG. 1.
Figure 7:
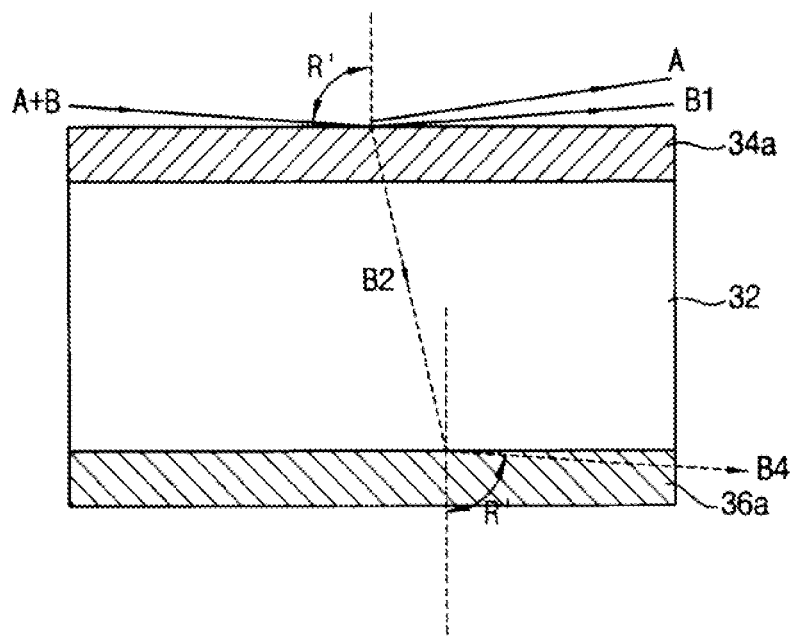
FIG. 7 is a view illustrating an optical path of the infrared beam of the modified spectral unit shown in FIG. 6.

FIG. 6 depicts another modified spectral unit of the beam generator shown in FIG. 1. FIG. 7 is a view illustrating an optical path of the infrared beam of the modified spectral unit shown in FIG. 6.

Referring to FIGS. 6 and 7, a modified spectral unit 30b may also include a single spectral layer similar to the spectral unit 30 shown in FIG. 2 and a pair of spectral layers coated on opposite surfaces of the body 32 similar to the modified spectral unit 30a shown in FIG. 4, except for the composition of the spectral layers. In an exemplary embodiment, a spectral unit including a pair of the spectral layers will be described in detail hereinafter, and thus the same reference numeral in FIGS. 4 and 5 denote the same elements in FIGS. 6 and 7 and any further detailed descriptions on the same elements will be omitted. However, the same inventive concept of the modified spectral unit 30b may also be applied to the spectral unit including a single spectral layer, as would be known to one of the ordinary skill in the art.

The modified beam splitter 30b may include the body 32 having a quartz plate with a high infrared transmittance and a pair of spectral layers 34a and 36a having a high EUV reflectivity coated on the first and second surfaces of the body 32 opposite to each other. Thus, a high proportion of the EUV beam may be reflected from the beam splitter 30b and a high proportion of the refracted infrared beam may be transmitted through the beam splitter 30b.

The first spectral layer 34a can separate the coherent infrared/EUV beam into separate infrared and EUV beams thereof and includes a material having an infrared Brewster's angle between about 70° to about 80°. In addition, the first spectral layer 34a may comprise niobium nitride (NbN) of which the infrared Brewster's angle may be greater than about 80°, and thus a high proportion of the EUV beam may be reflected from the first spectral layer 34a while minimizing the reflection of the infrared beam. The niobium nitride (NbN) layer 34a can have a thickness of about 30 nm to about 40 nm, and in particular, a thickness of about 35 nm to 37 nm, to cancel the reflected infrared beam by destructive interference.

In a present exemplary embodiment, the first spectral layer 34a may be thicker than the first spectral layer 34 of the beam splitter 30 shown in FIG. 2 and of the modified beam splitter 30a shown in FIG. 4 to effectively reduce the infrared reflectivity due destructive interference. Thus, although the deviation angle between the incidence angle and the Brewster's angle may be larger as compared with the modification 30a of the spectral layer, the infrared beam is not reflected from the surface of the spectral layer 34a. As a result, the coherent beam A+B may be incident onto the modified beam splitter 30b at an incidence angle greater than the Brewster's angle, thereby increasing the EUV beam reflectivity of the first spectral layer 34a.

The second spectral layer 36a can also prevent the refracted infrared beam B2 from reflecting back into the body 32 of the spectral unit 30b from the bottom surface of the body 32, as described in detail with reference to FIG. 4. When the second spectral layer 36a is coated on the bottom surface of the body 32, the refracted infrared beam B2 may refract into the second spectral layer 36a, thus minimizing the re-reflection of the refracted infrared beam B2 and reducing the absorption of the infrared beam. In particular, when the second spectral layer 36a has the same material and configuration as the first spectral layer 34a, the refracted infrared beam B2 may re-refract into the second spectral layer 36a as a re-refracted infrared beam B4 at a refraction angle substantially equal to the incidence angle R' of the coherent beam A+B. Since the first and the second spectral layers 34a and 36a may have the same material properties including the same Brewster's angle, the refracted infrared beam B2 refracts into the second spectral layer 36a rather than being reflected into the body 32, and propagates through the second spectral layer 36a in a direction parallel to that of the coherent beam A+B. Accordingly, the transmittance of the refracted infrared beam B2 may be increased by the second spectral layer 36a. While a present exemplary embodiment discloses a spectral layer 36a having the same thickness as the first spectral layer 34a, the second spectral layer 36a may have different thicknesses as long as the refracted infrared beam B2 is efficiently re-refracted into the second spectral layer 36a to thereby increase the transmittance of the infrared beam through the beam splitter 30b.

The modified beam splitter 30b may be configured with respect to the beam selector 26 so that the coherent beam A+B is incident onto the modified beam splitter 30b at an incidence angle greater than the infrared Brewster's angle of the first spectral layer 34a. For example, the beam selector 26 and the beam splitter may be arranged in such a manner that the coherent beam A+B is incident onto the modified beam splitter 30b at an incidence angle R' greater than about 80°. The greater the incidence angle of the coherent beam A+B, the greater is the reflectivity of the EUV beam A from the first spectral layer 34a of the modified beam splitter 30b.

As illustrated in FIG. 7, when the coherent beam A+B is incident onto the beam splitter 30b at an incidence angle R' greater than about 80°, a high proportion of the EUV beam A may be reflected from the surface of the first spectral layer 34a due to the high incidence angle. In addition, the reflection of the infrared beam B1 may be minimized since the first spectral layer 3a has a large Brewster's angle. Further, when the infrared beam refracts into the quartz plate 32 of the beam splitter 30b due to the deviation between the incidence angle and the Brewster's angle, the refracted beam B2 propagates through the beam splitter 30b, thus minimizing the absorption of the refracted infrared beam B2 into the beam splitter 30b due to the high transmittance of the quartz plate 32. Further, the refracted infrared beam B2 may also re-refract into the second spectral layer 36a rather than being reflected from the bottom surface of the quartz plate 32, thereby increasing the transmittance of the refracted infrared beam B2 through the modified beam splitter 30b.

For example, when the coherent beam A+B is incident onto the modified beam splitter 30b at an incidence angle of about 86° and the first and the second spectral layers 34a and 36a have the same thickness of about 37 nm, the reflectivity of an EUV beam A having a wavelength of about 13.5 nm may be about 95% and the reflectivity of an infrared beam B having a wavelength of about 800 nm may be less than about 1% when the coherent beam A+B is separated into separate EUV and infrared beams A and B by the modified beam splitter 30b. In addition, the transmittance of the refracted infrared beam B2 may be greater than about 80% through the modified beam splitter 30b.

The above exemplary embodiments of the beam generator 100 may be installed in various apparatuses in which a short-wave beam is needed. For example, the beam generator 100 may be utilized as a beam source for an apparatus for generating an aerial image of an exposure mask which will be described in detail hereinafter.

Figure 8:
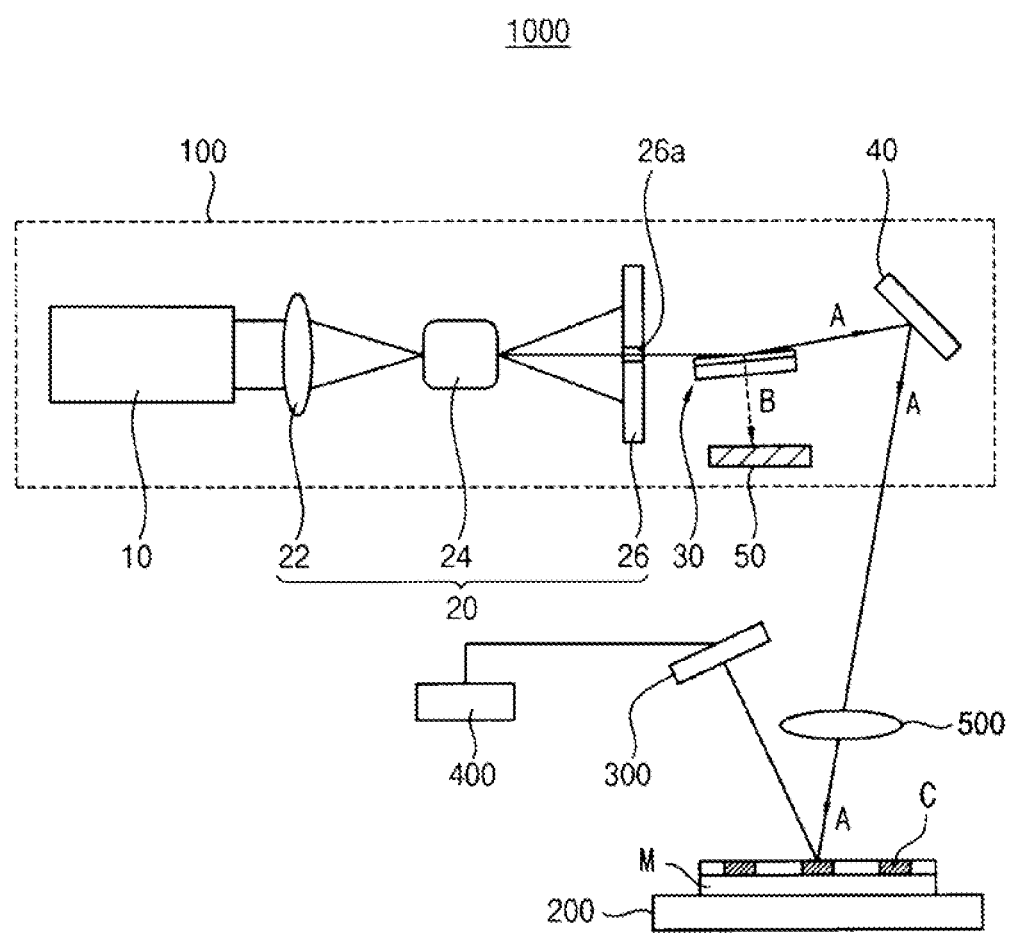
FIG. 8 is a structural view illustrating an apparatus for generating an aerial image using the beam generator shown in FIG. 1.

FIG. 8 is a structural view illustrating an apparatus for generating an aerial image using the beam generator shown in FIG. 1.

Referring to FIG. 8, an aerial image generating apparatus 1000 in accordance with an exemplary embodiment of the present inventive concept may include the beam generator 100 for generating a short wavelength beam from a laser beam, a support 200 for supporting a target mask M onto which the short wavelength beam is incident, a beam detector 300 for detecting the short wavelength beam reflected from the target mask and an operator 400 for converting optical energy information of the detected short wavelength beam into digital image signals, to generate an aerial image with respect to fine circuit patterns C on the target mask M.

The beam generator 100 can generate a short wavelength beam by processing a coherent laser beam so that the short wavelength beam has a shorter wavelength than the laser beam. In a present exemplary, the beam generator 100 includes a laser source emitting the laser beam, a short wavelength beam source generating a short wavelength beam coherent with the laser beam by processing the laser beam, and a spectral unit including a quartz plate and a first spectral layer coated on a first surface of the quartz plate, the first spectral layer having a laser beam Brewster's angle greater than 70° such that the short wavelength beam is reflected from the spectral unit without the laser beam. The beam generator 100 may have substantially the same structure and configuration as described in detail with reference to FIGS. 1 to 7 and thus any further detailed descriptions on the beam generator 100 will hereinafter be omitted.

The support 200 may include a flat plate and the target mask M can be mounted onto the support 200 and secured thereto for generating the aerial image for the target mask M. A plurality of the fine circuit patterns C may be formed on the target mask M and the aerial image visually displaying the fine circuit patterns C can be generated using the short wavelength beam from the beam generator 100. Thus, the support 200 may be positioned near the beam generator 100 so that the short wavelength beam may be irradiated onto the target mask M.

For example, the target mask M may include an optical reflection material for efficiently reflecting the short wavelength beam to the beam detector 300 and the fine circuit pattern C may have a line width less than about 45 nm. Thus, an extreme ultra-violet (EUV) beam can be used as the short wavelength beam A and the beam generator 100 can generate the EUV beam as a beam source for the aerial image generating apparatus 1000.

In addition, the aerial image generating apparatus 1000 may further include a Fresnel lens 500 interposed between the beam generator 100 and the target mask M, to focus the short wavelength beam A into a single focal point beam AA incident on the target mask M. In particular, the Fresnel lens 500 may be positioned on an optical path between the target mask M and the reflecting unit 40 which reflects the short wavelength beam A toward the Fresnel lens 500 to be focused into the single focal point beam AA. In a present exemplary embodiment, the EUV beam may be focused onto the target mask M through the Fresnel lens 500, thereby improving the resolution of the aerial image of the target mask M.

The beam detector 300 can detect the optical information of the short wavelength beam reflected from the target mask M. For example, the beam detector 300 may be located at a stationary position and the support 200 to which the target mask M is secured can move periodically in the X and Y direction. Thus, a whole surface of the target mask M can be scanned by the beam detector 300 by the relative movement of the support 200 with respect to the beam detector 300. The short wavelength beam is reflected from the target mask M due to the fine circuit patterns C thereon and thus the optical information of the reflected short wavelength beam varies according to the fine circuit patterns C.

The operator 400 can convert the optical information of the detected short wavelength beam into digital image signals, to generate the aerial image of the fine circuit patterns C on the target mask M. The operator 400 may include a monitor (not illustrated) for displaying the aerial images for the fine circuit patterns on the target mask M.

According to an aerial image generating apparatus, an aerial image for an exposure mask can be generated using the same short wavelength beam as is used in an exposure process, and thus an aerial image for an exposure mask can be generated without any additional beam sources, thereby facilitating the mask inspection process for detecting defects on an exposure mask.

Figure 9:
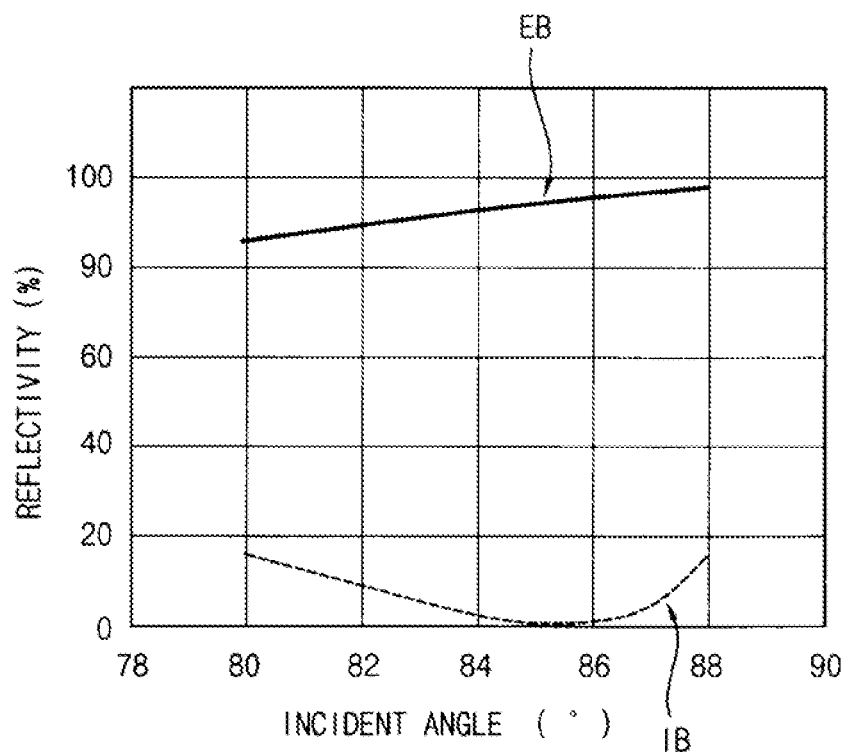
FIG. 9 is a graph showing the reflectivity of the P-polarized EUV beam and the P-polarized infrared beam when the modified beam splitter of FIG. 6 is installed in the beam generator.

FIG. 9 is a graph showing the reflectivity of a P-polarized EUV beam and a P-polarized infrared beam when the modified beam splitter 30*b* shown in FIG. 6 is installed in the beam generator. In FIG. 9, the horizontal axis denotes the incidence angle of the coherent infrared/EUV beam and the vertical axis denotes the reflectivity of the EUV beam and the infrared beam.

Referring to FIG. 9, when the coherent infrared/EUV beam is incident onto the beam splitter 30*b* at the incidence angle greater than about 80°, the reflectivity of the P-polarized infrared beam IB is less than about 20%. In particular, the reflectivity of the P-polarized infrared beam IB decreases to as little as about 1% when the coherent beam has an incidence angle onto the beam splitter 30*b* that is about 85° to about 86°.

In addition, when the coherent beam has an incidence angle onto the beam splitter 30*b* greater than about 80°, the reflectivity of the P-polarized EUV beam EB is greater than about 85%. In particular, the reflectivity of the P-polarized EUV beam EB decreases by less than about 5% when the coherent beam has an incidence angle onto the beam splitter 30*b* between about 85° to about 86°.

Thus, FIG. 9 indicates that the spectral layer having a higher beam splitter Brewster's angle may increase the reflectivity of the EUV beam and decrease the reflectivity of the infrared beam when the coherent infrared/EUV beam is incident onto the spectral layer of the beam splitter.

According to exemplary embodiments of the present inventive concept, the beam generator may include a spectral unit or a beam splitter having a large Brewster's angle and a high transmittance, thereby increasing the reflectivity of a shortwave EUV beam and decreasing the reflectivity and absorptivity of the laser beam coherent with the shortwave beam. Accordingly, the optical efficiency of the shortwave beam may increase and the increased EUV beam reflectivity of the may increase the resolution of the aerial image in the aerial image generating apparatus. Further, no additional cooling system is needed for the beam splitter, thereby reducing the operational and maintenance cost of the beam generator.

In addition, the infrared beam transmitted through the beam splitter may be monitored and thus the operational states of the beam generator and the aerial image generating apparatus including the beam generator may also be controlled in real time.

The beam generator may be used as a beam source for the aerial image generating apparatus for generating the aerial image for an exposure mask in the mask inspection process.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A beam generator comprising:
a laser source configured to emit a laser beam;
a short wavelength beam source configured to generate a short wavelength beam from the laser beam, the short wavelength beam being coherent with and having a wavelength shorter than that of the laser beam; and
a spectral unit including a quartz plate and a first spectral layer coated on a first surface of the quartz plate, wherein the first spectral layer has a Brewster's angle greater than about 70° with respect to the laser beam wherein the short wavelength beam is reflected from the spectral unit without the laser beam,
wherein the first spectral layer includes a ruthenium layer that has a predetermined thickness determined to cancel the infrared beam by destructive interference of first and second reflected infrared beams respectively reflected from top and bottom surfaces of the spectral layer when the infrared beam is incident onto the spectral layer at an incidence angle less than the Brewster's angle.

2. The beam generator of claim 1, wherein the laser beam includes a P-polarized infrared laser beam and the short wavelength beam includes a P-polarized extreme ultra-violet (EUV) beam, and the spectral unit and the short wavelength beam source are configured with respect to each other wherein the EUV beam and the infrared beam are simultaneously incident onto the first spectral layer at an incidence angle greater than the Brewster's angle of the first spectral layer with respect to the infrared laser beam.

3. The beam generator of claim 1, wherein the spectral unit includes a second spectral layer coated on a second surface opposite to the first surface of the quartz plate, the second spectral layer including a same material as the first spectral layer.

4. The beam generator of claim 1, wherein the short wavelength beam source includes a focusing lens configured to focus the laser beam, a gas cell in which the focused laser beam generates the short wavelength beam, and a beam selector configured to guide a $0^{th}$ order diffraction beam of the short wavelength beam to the spectral unit.

5. The beam generator of claim 4, wherein the gas cell is filled with neon (Ne) gas.

6. The beam generator of claim 1, further comprising a monitoring unit for monitoring a transmitted portion of the infrared beam transmitted through the quartz plate of the spectral unit.

7. The beam generator of claim 1, further comprising a reflecting unit configured to reflect the short wavelength beam onto a target.

8. The beam generator of claim 7, wherein the reflecting unit includes a multilayered stacked structure having alternating layers of molybdenum and silicon.

9. A beam generator comprising:
a beam source configured to generate an infrared laser beam and an extreme ultraviolet (EUV) beam coherent with each other; and
a spectral unit including a quartz plate and a first spectral layer coated on a first surface of the quartz plate, wherein the first spectral layer has a Brewster's angle greater than about 70° with respect to the infrared laser beam wherein the EUV beam is reflected from the spectral unit without the laser beam, and the spectral unit and the beam source are configured with respect to each other wherein the EUV beam and the infrared beam are simultaneously incident onto the first spectral layer at an incidence angle greater than the Brewster's angle of the first spectral layer with respect to the infrared laser beam, wherein the first spectral layer includes a niobium nitride layer whose thickness is determined to cancel the infrared beam by destructive interference of first and second reflected infrared beams respectively reflected from top and bottom surfaces of the spectral layer when the infrared beam is incident onto the spectral layer at an incidence angle less than the Brewster's angle.

10. The beam generator of claim 9, wherein the beam source comprises:

a laser source configured to emit the laser beam; and
a short wavelength beam source configured to generate the EUV beam from the laser beam,
wherein the short wavelength beam source includes a focusing lens configured to focus the laser beam, a gas cell containing neon gas with which the focused laser beam interacts to generate the EUV beam, and a beam selector for guiding a $0^{th}$ order diffraction beam of the EUV beam to the spectral unit.

11. The beam generator of claim 9, wherein the infrared laser beam is a P-polarized infrared laser beam and the EUV beam is a P-polarized EUV beam, and the spectral unit includes a second spectral layer coated on a second surface opposite to the first surface of the quartz plate, the second spectral layer including a same material as the first spectral layer.

* * * * *